(12) United States Patent
Goodwin

(10) Patent No.: US 7,511,968 B2
(45) Date of Patent: *Mar. 31, 2009

(54) BUFFERED THIN MODULE SYSTEM AND METHOD

(75) Inventor: Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 327 days.

This patent is subject to a terminal disclaimer.

(21) Appl. No.: 11/007,551

(22) Filed: Dec. 8, 2004

(65) Prior Publication Data

US 2006/0050497 A1 Mar. 9, 2006

Related U.S. Application Data

(63) Continuation-in-part of application No. 10/934,027, filed on Sep. 3, 2004.

(51) Int. Cl.
*H05K 1/11* (2006.01)

(52) U.S. Cl. .................. 361/803; 361/749; 361/789; 361/790; 174/254; 174/268; 257/723; 257/726; 257/737

(58) Field of Classification Search .................. 361/749, 361/803, 789, 790; 174/254, 268; 257/E23.065–E23.067, 257/668, 686, 723, 726, 737; 365/51, 233
See application file for complete search history.

(56) References Cited

U.S. PATENT DOCUMENTS

| | | | |
|---|---|---|---|
| 3,372,310 A | 3/1968 | Kantor | |
| 3,436,604 A | 4/1969 | Hyltin | |

(Continued)

FOREIGN PATENT DOCUMENTS

EP 122-687 (A) 10/1984

(Continued)

OTHER PUBLICATIONS

Search Report for GB Application No. GB0516622.8, May 25, 2006.

(Continued)

*Primary Examiner*—Dean A. Reichard
*Assistant Examiner*—Xiaoliang Chen
(74) *Attorney, Agent, or Firm*—Fish & Richardson P.C.

(57) ABSTRACT

Multiple fully buffered DIMM circuits or instantiations are presented in a single module. In a preferred embodiment, memory integrated circuits (preferably CSPs) and accompanying AMBs are arranged in two ranks in two fields on each side of a flexible circuit. The flexible circuit has expansion contacts disposed along one side. The flexible circuit is disposed about a supporting substrate or board to place one complete FB-DIMM circuit or instantiation on each side of the constructed module. In alternative but also preferred embodiments, the ICs on the side of the flexible circuit closest to the substrate are disposed, at least partially, in what are, in a preferred embodiment, windows, pockets, or cutaway areas in the substrate. Other embodiments may only populate one side of the flexible circuit or may only remove enough substrate material to reduce but not eliminate the entire substrate contribution to overall profile. The flexible circuit may exhibit one or two or more conductive layers, and may have changes in the layered structure or have split layers. Other embodiments may stagger or offset the ICs or include greater numbers of ICs.

14 Claims, 16 Drawing Sheets

U.S. PATENT DOCUMENTS

| | | |
|---|---|---|
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A * | 1/1998 | Clayton ..................... 257/723 |
| 5,714,802 A | 2/1998 | Cloud et al. |
| 5,717,556 A | 2/1998 | Yanagida |
| 5,729,894 A | 3/1998 | Rostoker et al. |
| 5,731,633 A * | 3/1998 | Clayton ..................... 257/723 |
| 5,739,887 A * | 4/1998 | Ueda et al. .................. 349/149 |
| 5,744,862 A | 4/1998 | Ishii |
| 5,751,553 A * | 5/1998 | Clayton ..................... 361/749 |
| 5,754,409 A * | 5/1998 | Smith ......................... 361/803 |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |

| | | | | | | |
|---|---|---|---|---|---|---|
| 6,025,992 | A | 2/2000 | Dodge et al. | 6,489,687 | B1 | 12/2002 | Hashimoto |
| 6,028,352 | A | 2/2000 | Eide | 6,502,161 | B1 | 12/2002 | Perego et al. |
| 6,028,365 | A | 2/2000 | Akram et al. | 6,514,793 | B2 | 2/2003 | Isaak |
| 6,034,878 | A | 3/2000 | Osaka et al. | 6,521,984 | B2 | 2/2003 | Matsuura |
| 6,038,132 | A | 3/2000 | Tokunaga et al. | 6,528,870 | B2 | 3/2003 | Fukatsu et al. |
| 6,040,624 | A | 3/2000 | Chambers et al. | 6,531,772 | B2 | 3/2003 | Akram et al. |
| 6,049,975 | A * | 4/2000 | Clayton ............... 29/832 | 6,544,815 | B2 | 4/2003 | Isaak |
| 6,060,339 | A | 5/2000 | Akram et al. | 6,552,910 | B1 | 4/2003 | Moon et al. |
| 6,072,233 | A | 6/2000 | Corisis et al. | 6,552,948 | B2 | 4/2003 | Woo et al. |
| 6,078,515 | A | 6/2000 | Nielsen et al. | 6,560,117 | B2 | 5/2003 | Moon |
| 6,084,294 | A | 7/2000 | Tomita | 6,566,746 | B2 | 5/2003 | Isaak et al. |
| 6,091,145 | A * | 7/2000 | Clayton ............... 257/724 | 6,572,387 | B2 | 6/2003 | Burns et al. |
| 6,097,087 | A | 8/2000 | Farnworth et al. | 6,573,593 | B1 | 6/2003 | Syri et al. |
| 6,111,757 | A | 8/2000 | Dell et al. | 6,576,992 | B1 * | 6/2003 | Cady et al. ............... 257/686 |
| 6,121,676 | A | 9/2000 | Solberg | 6,588,095 | B2 | 7/2003 | Pan |
| RE36,916 | E | 10/2000 | Moshayedi | 6,590,282 | B1 | 7/2003 | Wang et al. |
| 6,157,541 | A | 12/2000 | Hacke | 6,600,222 | B1 | 7/2003 | Levardo |
| 6,172,874 | B1 | 1/2001 | Bartilson | 6,614,664 | B2 | 9/2003 | Lee |
| 6,178,093 | B1 | 1/2001 | Bhatt et al. | 6,627,984 | B2 | 9/2003 | Bruce et al. |
| 6,180,881 | B1 * | 1/2001 | Isaak ............... 174/524 | 6,629,855 | B1 | 10/2003 | North et al. |
| 6,187,652 | B1 | 2/2001 | Chou et al. | 6,646,936 | B2 | 11/2003 | Hamamatsu et al. |
| 6,205,654 | B1 | 3/2001 | Burns | 6,660,561 | B2 | 12/2003 | Forthun |
| 6,208,521 | B1 | 3/2001 | Nakatsuka | 6,661,092 | B2 | 12/2003 | Shibata et al. |
| 6,208,546 | B1 | 3/2001 | Ikeda | 6,677,670 | B2 | 1/2004 | Kondo |
| 6,214,641 | B1 | 4/2001 | Akram | 6,683,377 | B1 | 1/2004 | Shim et al. |
| 6,215,181 | B1 | 4/2001 | Akram et al. | 6,690,584 | B2 | 2/2004 | Uzuka et al. |
| 6,215,687 | B1 | 4/2001 | Sugano et al. | 6,699,730 | B2 | 3/2004 | Kim et al. |
| 6,222,737 | B1 | 4/2001 | Ross | 6,712,226 | B1 | 3/2004 | Williams, Jr. |
| 6,222,739 | B1 | 4/2001 | Bhakta et al. | 6,720,652 | B2 | 4/2004 | Akram et al. |
| 6,225,688 | B1 | 5/2001 | Kim et al. | 6,721,181 | B1 | 4/2004 | Pfeifer et al. |
| 6,232,659 | B1 * | 5/2001 | Clayton ............... 257/724 | 6,721,185 | B2 | 4/2004 | Dong et al. |
| 6,233,650 | B1 | 5/2001 | Johnson et al. | 6,744,656 | B2 | 6/2004 | Sugano et al. |
| 6,234,820 | B1 | 5/2001 | Perino et al. | 6,751,113 | B2 | 6/2004 | Bhakta et al. |
| 6,262,476 | B1 | 7/2001 | Vidal | 6,756,661 | B2 | 6/2004 | Tsuneda et al. |
| 6,262,895 | B1 | 7/2001 | Forthun | 6,760,220 | B2 | 7/2004 | Canter et al. |
| 6,265,660 | B1 | 7/2001 | Tandy | 6,762,942 | B1 | 7/2004 | Smith |
| 6,266,252 | B1 | 7/2001 | Karabatsos | 6,768,660 | B2 | 7/2004 | Kong et al. |
| 6,281,577 | B1 | 8/2001 | Oppermann et al. | 6,833,981 | B2 | 12/2004 | Suwabe et al. |
| 6,288,907 | B1 | 9/2001 | Burns | 6,833,984 | B1 | 12/2004 | Belgacem |
| 6,288,924 | B1 | 9/2001 | Sugano et al. | 6,839,266 | B1 | 1/2005 | Garrett, Jr. et al. |
| 6,300,679 | B1 | 10/2001 | Mukerji et al. | 6,841,868 | B2 | 1/2005 | Akram et al. |
| 6,316,825 | B1 | 11/2001 | Park et al. | 6,850,414 | B2 | 2/2005 | Benisek et al. |
| 6,323,060 | B1 | 11/2001 | Isaak | 6,873,534 | B2 | 3/2005 | Bhakta et al. |
| 6,336,262 | B1 | 1/2002 | Dalal et al. | 6,878,571 | B2 | 4/2005 | Isaak et al. |
| 6,343,020 | B1 | 1/2002 | Lin et al. | 6,884,653 | B2 | 4/2005 | Larson |
| 6,347,394 | B1 | 2/2002 | Ochoa et al. | 6,914,324 | B2 | 7/2005 | Rapport et al. |
| 6,349,050 | B1 | 2/2002 | Woo et al. | 6,919,626 | B2 | 7/2005 | Burns |
| 6,351,029 | B1 | 2/2002 | Isaak | 6,956,284 | B2 | 10/2005 | Cady et al. |
| 6,357,023 | B1 | 3/2002 | Co et al. | 7,053,478 | B2 | 5/2006 | Roper et al. |
| 6,358,772 | B2 | 3/2002 | Miyoshi | 7,094,632 | B2 | 8/2006 | Cady et al. |
| 6,360,433 | B1 | 3/2002 | Ross | 7,180,167 | B2 * | 2/2007 | Partridge et al. ............ 257/686 |
| 6,368,896 | B2 | 4/2002 | Farnworth et al. | 7,289,327 | B2 * | 10/2007 | Goodwin et al. ............ 361/701 |
| 6,370,668 | B1 | 4/2002 | Garrett, Jr. et al. | 2001/0001085 | A1 | 5/2001 | Hassanzadeh et al. |
| 6,376,769 | B1 | 4/2002 | Chung | 2001/0006252 | A1 | 7/2001 | Kim et al. |
| 6,392,162 | B1 | 5/2002 | Karabatsos | 2001/0013423 | A1 | 8/2001 | Dalal et al. |
| 6,404,043 | B1 | 6/2002 | Isaak | 2001/0015487 | A1 | 8/2001 | Forthun |
| 6,410,857 | B1 | 6/2002 | Gonya | 2001/0026009 | A1 | 10/2001 | Tsuneda et al. |
| 6,426,240 | B2 | 7/2002 | Isaak | 2001/0028588 | A1 | 10/2001 | Yamada et al. |
| 6,426,549 | B1 | 7/2002 | Isaak | 2001/0035572 | A1 | 11/2001 | Isaak |
| 6,426,560 | B1 | 7/2002 | Kawamura et al. | 2001/0040793 | A1 | 11/2001 | Inaba |
| 6,428,360 | B2 | 8/2002 | Hassanzadeh et al. | 2001/0052637 | A1 | 12/2001 | Akram et al. |
| 6,433,418 | B1 | 8/2002 | Fujisawa et al. | 2002/0001216 | A1 | 1/2002 | Sugano et al. |
| 6,444,921 | B1 * | 9/2002 | Wang et al. ............... 174/260 | 2002/0006032 | A1 | 1/2002 | Karabatsos |
| 6,446,158 | B1 | 9/2002 | Karabatsos | 2002/0030995 | A1 | 3/2002 | Shoji |
| 6,449,159 | B1 * | 9/2002 | Haba ............... 361/707 | 2002/0076919 | A1 | 6/2002 | Peters et al. |
| 6,452,826 | B1 | 9/2002 | Kim et al. | 2002/0094603 | A1 | 7/2002 | Isaak |
| 6,459,152 | B1 | 10/2002 | Tomita et al. | 2002/0101261 | A1 | 8/2002 | Karabatsos |
| 6,462,412 | B2 | 10/2002 | Kamei et al. | 2002/0139577 | A1 | 10/2002 | Miller |
| 6,465,877 | B1 | 10/2002 | Farnworth et al. | 2002/0164838 | A1 | 11/2002 | Moon et al. |
| 6,465,893 | B1 | 10/2002 | Khandros et al. | 2002/0180022 | A1 | 12/2002 | Emoto |
| 6,472,735 | B2 | 10/2002 | Isaak | 2002/0185731 | A1 | 12/2002 | Akram et al. |
| 6,473,308 | B2 | 10/2002 | Forthun | 2002/0196612 | A1 | 12/2002 | Gall et al. |
| 6,486,544 | B1 | 11/2002 | Hashimoto | 2003/0002262 | A1 | 1/2003 | Benisek et al. |

| | | | |
|---|---|---|---|
| 2003/0026155 A1 | 2/2003 | Yamagata | |
| 2003/0035328 A1 | 2/2003 | Hamamatsu et al. | |
| 2003/0045025 A1 | 3/2003 | Coyle et al. | |
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1* | 6/2003 | Miyamoto et al. | 257/678 |
| 2003/0159278 A1 | 8/2003 | Peddle | |
| 2003/0168725 A1 | 9/2003 | Warner et al. | |
| 2003/0234443 A1* | 12/2003 | Partridge et al. | 257/686 |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1* | 11/2004 | Cady et al. | 438/109 |
| 2004/0236877 A1* | 11/2004 | Burton | 710/22 |
| 2004/0256773 A1* | 12/2004 | Mao et al. | 257/773 |
| 2004/0262737 A1* | 12/2004 | Haba | 257/692 |
| 2005/0018412 A1* | 1/2005 | Roper et al. | 361/803 |
| 2005/0047776 A1* | 3/2005 | Watanabe et al. | 396/543 |
| 2005/0057911 A1* | 3/2005 | Rapport et al. | 361/803 |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0146031 A1* | 7/2005 | Partridge et al. | 257/738 |
| 2005/0242423 A1 | 11/2005 | Partridge et al. | |
| 2005/0259504 A1* | 11/2005 | Murtugh et al. | 365/233 |
| 2005/0263911 A1 | 12/2005 | Igarashi et al. | |
| 2005/0289287 A1* | 12/2005 | Shin et al. | 711/1 |
| 2006/0020740 A1* | 1/2006 | Bartley et al. | 711/100 |
| 2006/0048385 A1* | 3/2006 | Cady et al. | 29/860 |
| 2006/0049500 A1* | 3/2006 | Goodwin | 257/686 |
| 2006/0050488 A1* | 3/2006 | Goodwin | 361/749 |
| 2006/0050489 A1* | 3/2006 | Wehrly et al. | 361/749 |
| 2006/0050496 A1* | 3/2006 | Goodwin | 361/803 |
| 2006/0050497 A1* | 3/2006 | Goodwin | 361/803 |
| 2006/0050498 A1* | 3/2006 | Cady et al. | 361/803 |
| 2006/0053345 A1 | 3/2006 | Goodwin | |
| 2006/0083043 A1 | 4/2006 | Cypher | 365/51 |
| 2006/0090112 A1* | 4/2006 | Cochran et al. | 714/737 |
| 2006/0091529 A1 | 5/2006 | Wehrly et al. | |
| 2006/0095592 A1* | 5/2006 | Borkenhagen | 710/2 |
| 2006/0111866 A1 | 5/2006 | LeClerg et al. | |
| 2006/0125067 A1 | 6/2006 | Wehrly et al. | |
| 2007/0111606 A1* | 5/2007 | Goodwin | 439/633 |
| 2007/0115017 A1* | 5/2007 | Goodwin et al. | 324/763 |
| 2007/0126124 A1* | 6/2007 | Rapport et al. | 257/777 |
| 2007/0176286 A1* | 8/2007 | Wehrly | 257/723 |
| 2007/0201208 A1* | 8/2007 | Goodwin et al. | 361/701 |
| 2007/0258217 A1* | 11/2007 | Roper et al. | 361/709 |

FOREIGN PATENT DOCUMENTS

| | | |
|---|---|---|
| EP | 0 298 211 A3 | 1/1989 |
| EP | 1.119049 A2 | 7/2001 |
| GB | 2 130 025 A | 5/1984 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

PCT/US05/28547 International Search Report and Written Opinion, PCT, Aug. 18, 2006.
PCT/US05/28547 Notification Concerning Transmittal of Copy of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
PCT/US2006/007193, International Search Report and Written Opinion of the International Searching Authority, PCT, Nov. 7, 2007.
U.S. Appl. No. 11/306,803, filed Jan. 11, 2006, Chris Karabatsos.
Complaint filed Mar. 8, 2007, in the United States District Court for the District of massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.
PCT/US06/06921 International Search Report and Written Opinion, PCT, Jun. 1, 2007.
PCT/US05/28547 International Search report, PCt, Aug. 18, 2006.
Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductyor Intellectual Property, Chip Scale Packaging—Website pp. (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 COMS SRAM Module.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

* cited by examiner

BUFFERED THIN MODULE SYSTEM AND METHOD

RELATED APPLICATIONS

This application is a continuation-in-part of U.S. patent application Ser. No. 10/934,027, filed Sep. 3, 2004. U.S. patent application Ser. No. 10/934,027 has been incorporated by reference herein.

FIELD

The present invention relates to systems and methods for creating high density circuit modules.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs provide, however, very limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be address per channel. With the DDR2-400 bus protocol, only 72 devices per channel may be addressed. This constraint has led to the development of the fully-buffered DIMM (FB-DIMM) with buffered C/A and data in which 288 devices per channel may be addressed. With the FB-DIMM, not only has capacity increased, pin count has declined to approximately 69 from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility.

This great has, however, come with some cost and will eventually be self-limiting. The basic principle of systems that employ FB-DIMM relies upon a point-to-point or serial addressing scheme rather than the parallel multi-drop interface that dictates non-buffered DIMM addressing. That is, one DIMM is in point-to-point relationship with the memory controller and each DIMM is in point-to-point relationship with adjacent DIMMs. Consequently, as bus speeds increase, the number of DIMs on a bus will decline as the discontinuities caused by the chain of point to point connections from the controller to the "last" DIMM become magnified in effect as speeds increase. Consequently, methods to increase the capacity of a single DIMM find value in contemporary memory and computing systems.

There are several known methods to improve the limited capacity of a DIMM or other circuit board. In one strategy, for example, small circuit boards (daughter cards) are connected to the DIMM to provide extra mounting space. The additional connection may cause, however, flawed signal integrity for the data signals passing from the DIMM to the daughter card and the additional thickness of the daughter card(s) increases the profile of the DIMM.

Multiple die packages (MDP) are also used to increase DIMM capacity while preserving profile conformity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another strategy used to increase circuit board capacity. This scheme increases capacity by stacking packaged integrated circuits to create a high-density circuit module for mounting on the circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may alter, however, system requirements such as, for example, required cooling airflow or the minimum spacing around a circuit board on its host system.

What is needed, however, are methods and structures for increasing the flexibility of the FB-DIMM solution.

SUMMARY

Multiple fully buffered DIMM circuits or instantiations are combined in a single module to provide on a single module circuitry that is substantially the functional equivalent of two or more FB-DIMMs but avoids some of the drawbacks associated with having two discrete FB-DIMMs. In a preferred embodiment, integrated circuits (preferably memory CSPs) and accompanying AMBs are arranged in two ranks in two fields on each side of a flexible circuit. The flexible circuit has expansion contacts disposed along one side. The flexible circuit is disposed about a supporting substrate or board to place at least one FB-DIMM instantiation on each side of the constructed module. In alternative, but also preferred embodiments, the ICs on the side of the flexible circuit closest to the substrate are disposed, at least partially, in what are, in a preferred embodiment, windows, pockets, or cutaway areas in the substrate. Other embodiments may only populate one side of the flexible circuit or may only remove enough substrate material to reduce but not eliminate the entire substrate contribution to overall profile. Other embodiments may connect the constituent devices in a way that creates a FB-DIMM circuit or instantiation with the devices on the upper half of the module while another FB-DIMM instantiation is created with the devices on the lower half of the module. Other embodiments may, for example, combine selected circuitry from one side of the module (memory CSPs for example) with circuitry on the other side of the module (an AMB, for example) in creating one of plural FB-DIMM instantiations on a single module. Other embodiments employ stacks to provide multiple FB-DIMM circuits or instantiations on a low profile module. The flexible circuit may exhibit one or two or more conductive layers, and may have changes in the layered structure or have split layers. Other embodiments may stagger or offset the ICs or include greater numbers of ICs.

DETAILED DESCRIPTION OF PREFERRED EMBODIMENTS

Figure 1:
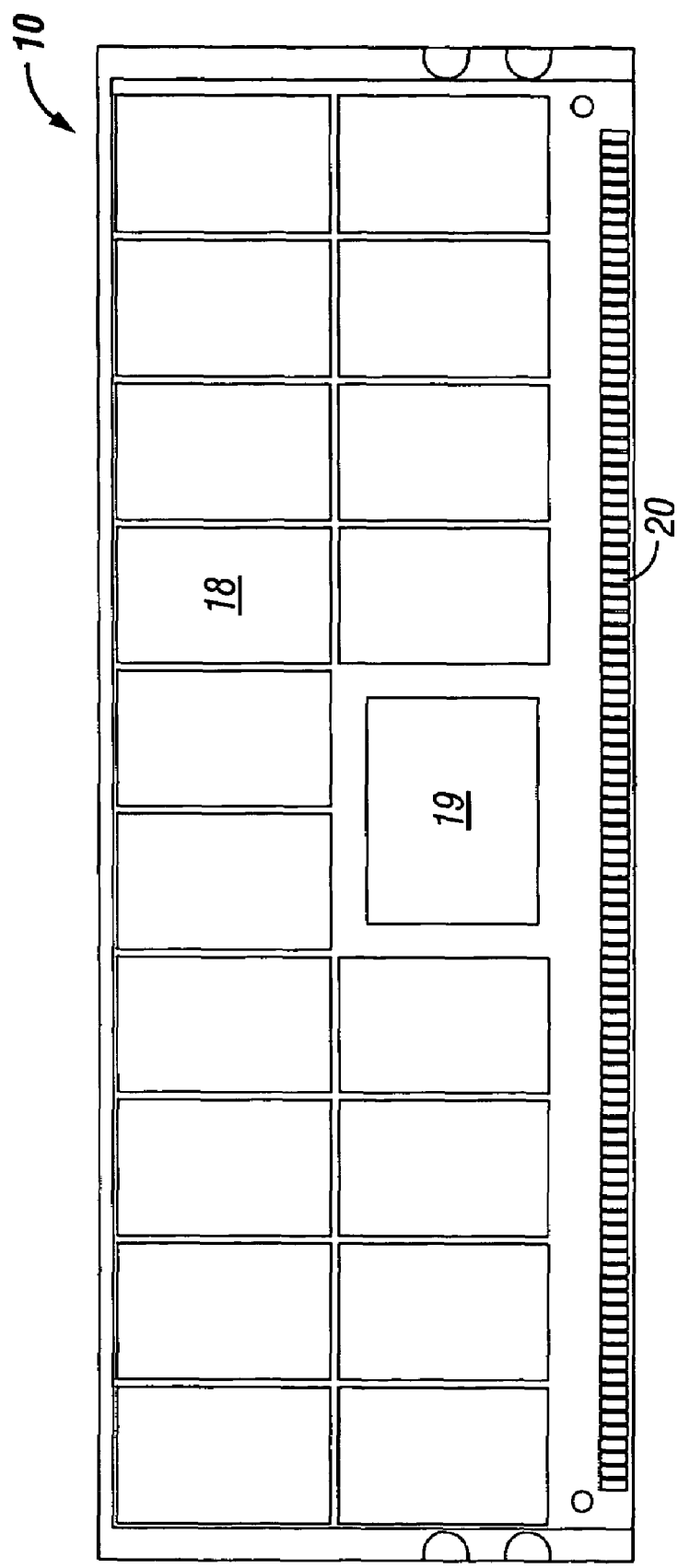
FIG. 1 is a depiction of a preferred embodiment of a module devised in accordance with the present invention.

FIG. 1 depicts a preferred embodiment devised in accordance with the present invention. Module 10 is depicted in FIG. 1 exhibiting ICs 18 and circuit 19.

Figure 2:
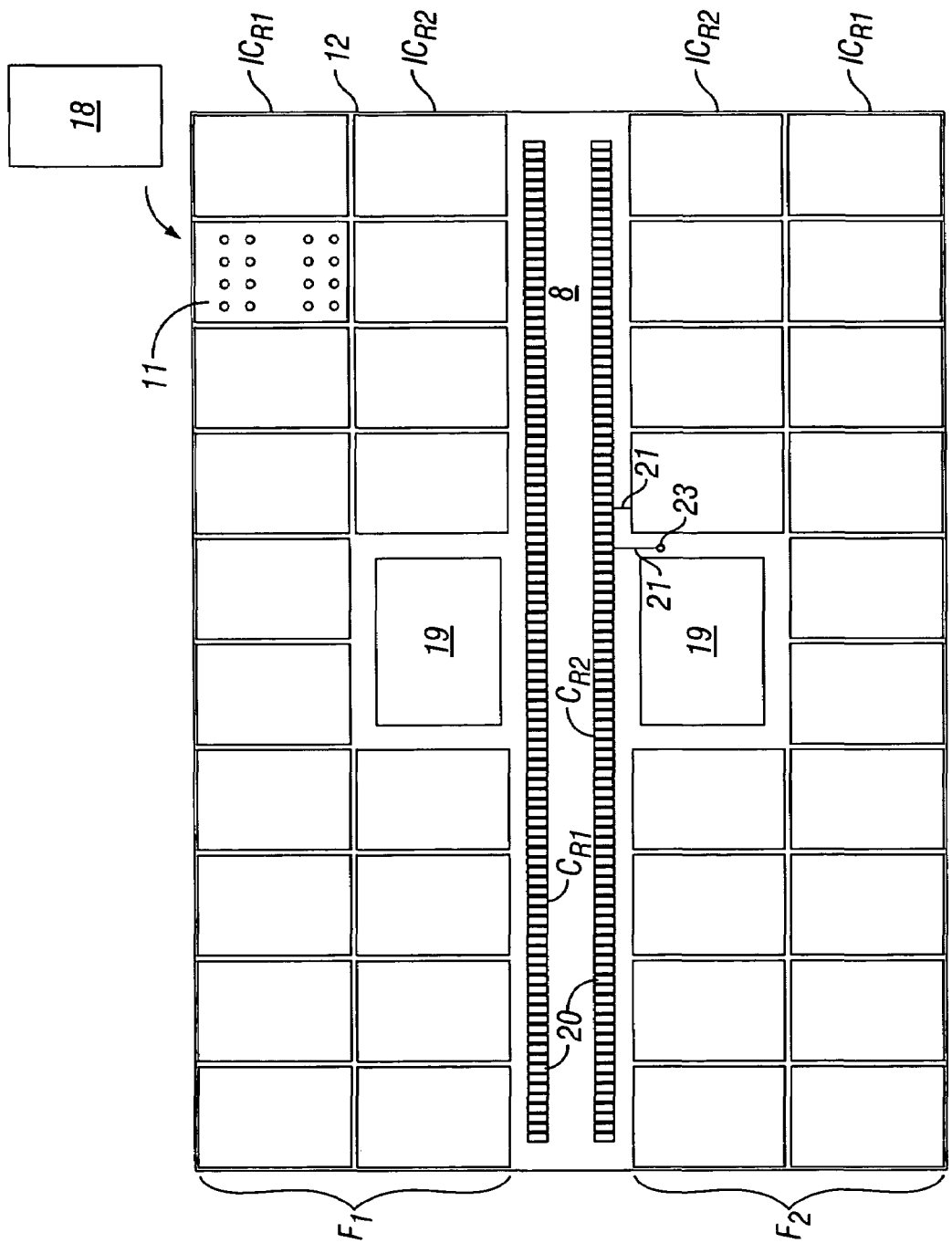
FIG. 2 depicts a contact bearing first side of a flex circuit devised in accordance with a preferred embodiment of the present invention.

FIG. 2 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers as further described with reference to later Figs. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board or module capability. Circuit 19 depicted between ICs 18 may be a memory buffer or controller but in a preferred embodiment is the well known advanced memory buffer or "AMB".

The depiction of FIG. 2 shows flex circuit 12 as having first and second fields F1 and F2. Each of fields F1 and F2 have at least one mounting contact array for CSPs such as the one depicted by reference 11A. Contact arrays such as array 11 are disposed beneath ICs 18 and circuits 19. An exemplar contact array 11A is shown as is exemplar IC 18 to be mounted at contact array 11A as depicted. The contact arrays 11A that correspond to an IC plurality may be considered a contact array set.

Field F1 of side 8 of flex circuit 12 is shown populated with first plurality of CSPs $IC_{R1}$ and second plurality of CSPs $IC_{R2}$ while second field F2 of side 8 of flex circuit 12 is shown populated with first plurality of CSPs $IC_{R1}$ and second plurality of CSPs $IC_{R2}$. Those of skill will recognize that the identified pluralities of CSPs are, when disposed in the configurations depicted, typically described as "ranks". Between the ranks $IC_{R2}$ of field F1 and $IC_{R2}$ of field F2, flex circuit 12 bears a plurality of module contacts allocated in this embodiment into two rows ($C_{R1}$ and $C_{R2}$) of module contacts 20. When flex circuit 12 is folded as later depicted, side 8 depicted in FIG. 2 is presented at the outside of module 10. The opposing side 9 of flex circuit 12 is on the inside in several depicted configurations of module 10 and thus side 9 is closer to the substrate 14 about which flex circuit 12 is disposed than is side 8. Other embodiments may have other numbers of ranks and combinations of plural CSPs connected to create the module of the present invention.

Figure 3:
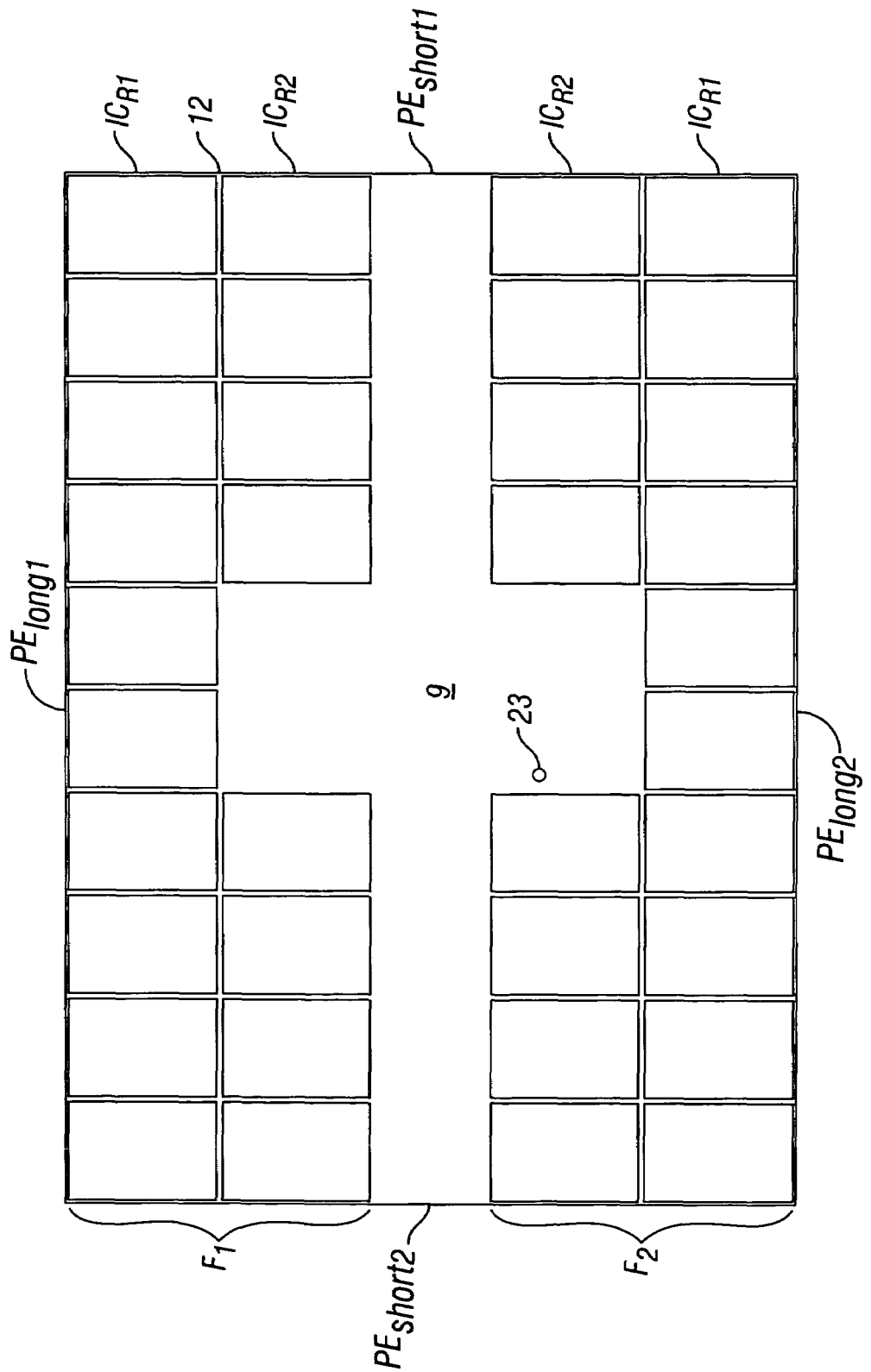
FIG. 3 depicts the second side of the exemplar populated flex circuit of FIG. 2.

FIG. 3 shows side 9 of flex circuit 12 depicting the other side of the flex circuit shown in FIG. 2. Side 9 of flex circuit 12 is shown as being populated with multiple CSPs 18. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs identified in FIG. 3 as $IC_{R1}$ and $IC_{R2}$. Thus, each side of flex circuit 12 has, in a preferred embodiment, two fields F1 and F2 each of which fields includes two ranks of CSPs $IC_{R1}$ and $IC_{R2}$. In later FIG. 4, it will be recognized that fields F1 and F2 will be disposed on different sides of substrate 14 in a completed module 10 when ICs 18 are identified according to the organizational identification depicted in FIGS. 2 and 3 but those of skill will recognize that the groupings of ICs 18 shown in FIGS. 2 and 3 are not dictated by the invention but are provided merely as an exemplar organizational strategy to assist in understanding the present invention.

Various discrete components such as termination resistors, bypass capacitors, and bias resistors, in addition to the buffers 19 shown on side 8 of flex circuit 12, may be mounted on either or both of sides 8 and 9 of flex 12. Such discrete components are not shown to simplify the drawing. Flex circuit 12 may also depicted with reference to its perimeter edges, two of which are typically long ($PE_{long1}$ and $PE_{long\,2}$) and two of which are typically shorter ($PE_{short1}$ and $PE_{short2}$). Other embodiments may employ flex circuits 12 that are not rectangular in shape and may be square in which case the perimeter edges would be of equal size or other convenient shape to adapt to manufacturing particulars. Other embodiments may also have fewer or greater numbers of ranks or pluralities of ICs in each field or on a side of a flex circuit.

FIG. 2 depicts an exemplar conductive trace 21 connecting row $C_{R2}$ of module contacts 20 to ICs 18. Those of skill will understand that there are many such traces in a typical embodiment. Traces 21 may also connect to vias that may transit to other conductive layers of flex 12 in certain embodiments having more than one conductive layer. In a preferred embodiment, vias connect ICs 18 on side 9 of flex 12 to module contacts 20. An example via is shown as reference 23. Traces 21 may make other connections between the ICs on either side of flex 12 and may traverse the rows of module contacts 20 to interconnect ICs. Together the various traces and vias make interconnections needed to convey data and control signals amongst the various ICs and buffer circuits. Those of skill will understand that the present invention may be implemented with only a single row of module contacts 20 and may, in other embodiments, be implemented as a module bearing ICs on only one side of flex circuit 12.

Figure 4:
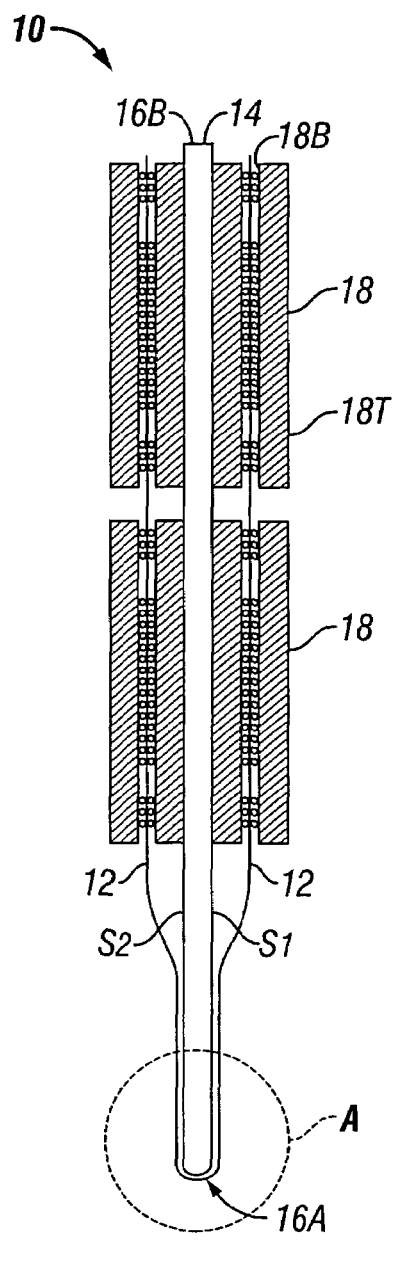
FIG. 4 is a cross-sectional depiction through the devices as populated in an embodiment of the present invention.

FIG. 4 is a cross section view of a module 10 devised in accordance with a preferred embodiment of the present invention. Module 10 is populated with ICs 18 having top surfaces $18_T$ and bottom surfaces $18_B$. Substrate or support structure 14 has first and second perimeter edges 16A and 16B appearing in the depiction of FIG. 4 as ends. Substrate or support structure 14 typically has first and second lateral sides $S_1$ and $S_2$. Flex 12 is wrapped about perimeter edge 16A of substrate 14, which in the depicted embodiment, provides the basic shape of a common DIMM board form factor such as that defined by JEDEC standard MO-256.

Figure 5:
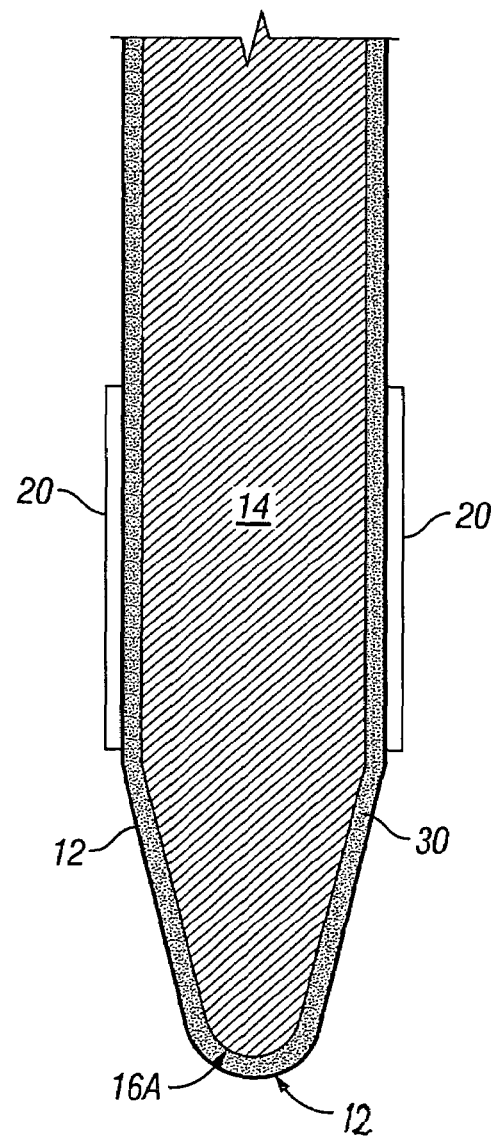
FIG. 5 is an enlarged view of the area marked 'A' in FIG. 4.

FIG. 5 is an enlarged view of the area marked 'A' in FIG. 4. Edge 16A of substrate 14 is shaped like a male side edge of an edge card connector. While a particular oval-like configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In some other embodiments, flex circuit 12 may be wrapped about perimeter edge 16B or both perimeter edges 16A and 16B of substrate 14. In other instances, multiple flex circuits may be employed or a single flex circuit may connect one or both sets of contacts 20 to the resident ICs.

Figure 6:
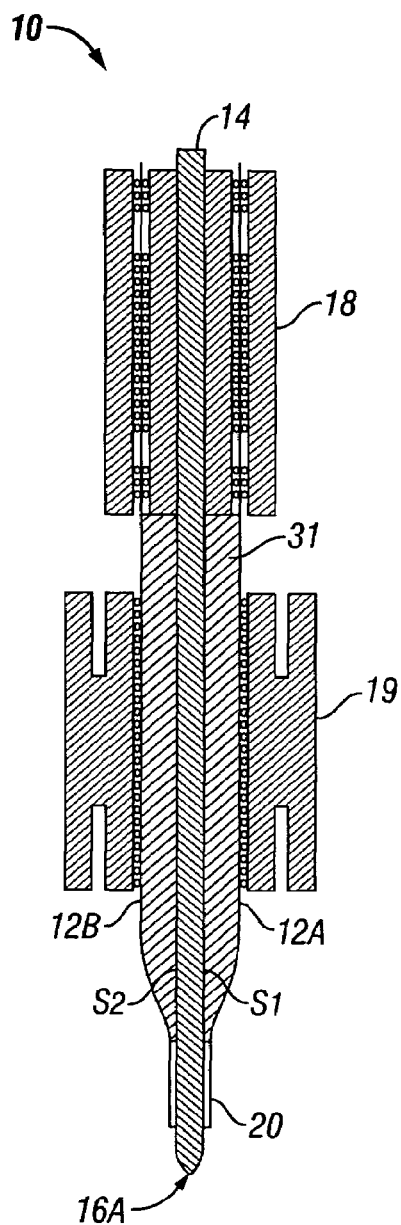
FIG. 6 depicts a cross-sectional view of a module devised in accordance with an alternate preferred embodiment of the present invention.

FIG. 6 depicts a cross-sectional view of a module 10 devised in accordance with an alternate preferred embodiment of the present invention with the view taken along a line through two AMBs and selected ICs 18 from $IC_{R1}$. The module 10 depicted in FIG. 6 differs from that shown in earlier embodiments in that rather than a single flex circuit 12, the depicted exemplar module 10 employs two flex circuits 12A and 12B with 12A being disposed on one lateral side S1 of substrate 14 while flex circuit 12B is employed on lateral side S2 of substrate 14.

Figure 7:
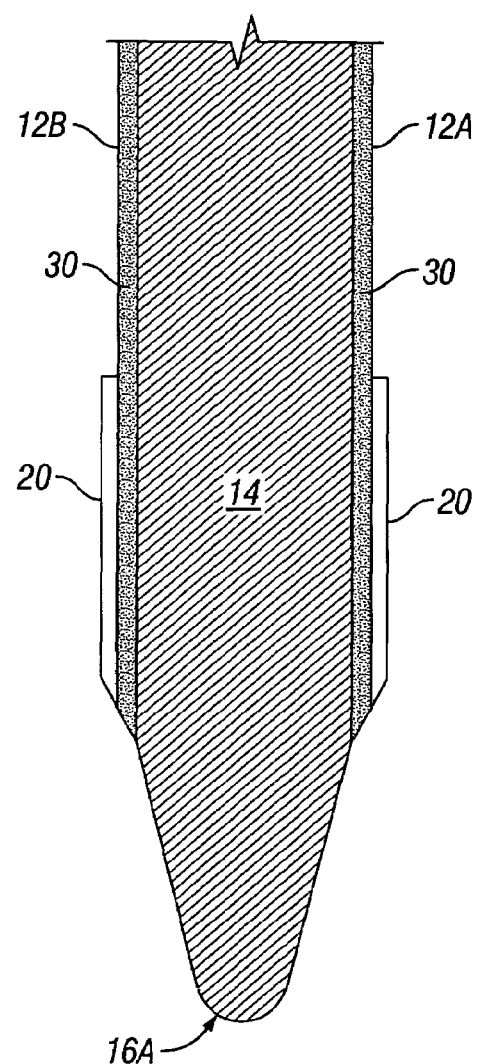
FIG. 7 depicts the area near an end of a substrate in the embodiment shown in FIG. 6.

FIG. 7 depicts the area near end 16A of substrate 14 in the embodiment shown in FIG. 6 that employs two flex circuits identified as 12A and 12B to implement a module in accordance with an alternate preferred embodiment of the present invention. Each of flex circuits 12A and 12B are populated with ICs 18 on one or both of their respective sides 8 and 9 and each of flex circuits 12A and 12B employ a buffer circuit 19 such as, for example, an advanced buffer circuit or AMB to implement, along with the resident CSPs, multiple FB-DIMM circuits mounted on a single module 10. The area on side 9 of each of flex circuits 12A and 12B opposite the disposition of buffer circuit 19 disposed along side 8 of flex circuits 12A and 12B is, in the depicted module, filled with a conformal material 31 to provide support along the length of module 10 where structure is not provided by the bodies of circuits such as ICs 18 or buffers 19.

Figure 8:
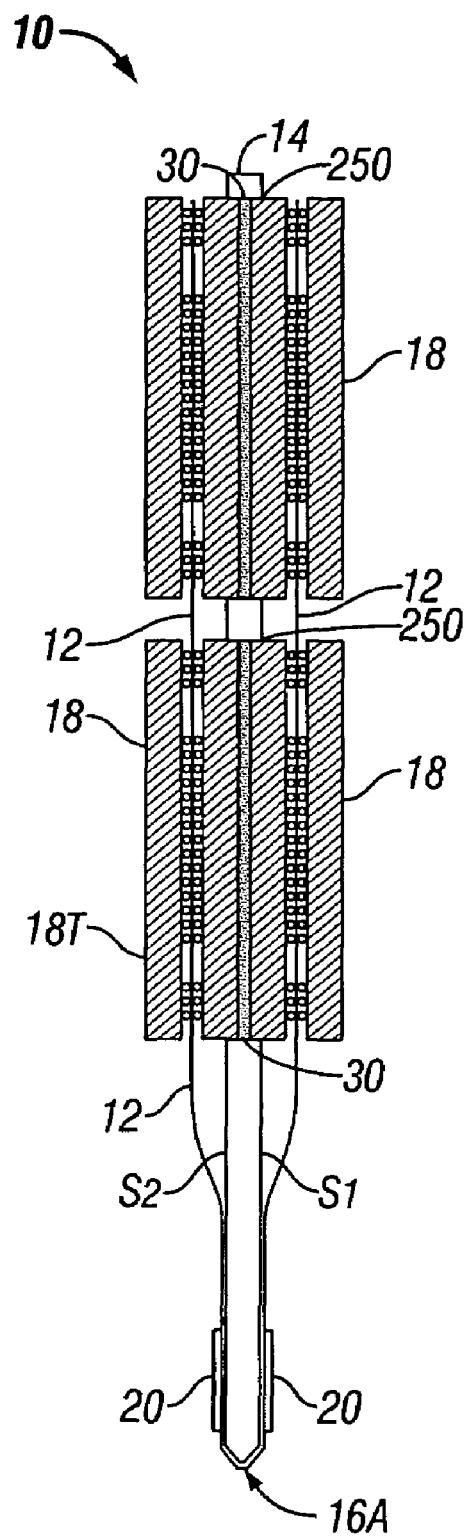
FIG. 8 depicts a cross-sectional view of a module assembly devised in accordance with a preferred embodiment of the present invention.

FIG. 8 depicts a cross-sectional view of a module 10 devised with a substrate 14 that has cutaway areas into which ICs 18 are disposed to reduce the profile of module 10. Corresponding ICs 18 from each of fields F1 and F2 pass through windows 250 in substrate 14 as shown in later Figs. in further detail and the inner ICs 18 are preferably attached to each other's upper surfaces $18_T$ with a thermally conductive adhesive 30. While in this embodiment, the depicted ICs are attached to flex circuit 12 in opposing pairs, fewer or greater numbers of ICs may be connected in other arrangements such as, for example, staggered or offset arrangements in which they may exhibit preferred thermal characteristics. In a preferred embodiment, ICs 18 will be CSPs and typically, memory CSPs. To simplify the drawing, discrete components such as resistors and capacitors typically found on embodiments of module 10 are not shown.

In this embodiment, flex circuit 12 has module contacts 20 positioned in a manner devised to fit in a circuit board card edge connector or socket and connect to corresponding contacts in the connector (not shown). While module contacts 20 are shown protruding from the surface of flex circuit 12, other embodiments may have flush contacts or contacts below the surface level of flex 12. Substrate 14 supports module contacts 20 from behind flex circuit 12 in a manner devised to provide the mechanical form required for insertion into a socket. In other embodiments, the thickness or shape of substrate 14 in the vicinity of perimeter edge 16A may differ from that in the vicinity of perimeter edge 16B. Substrate 14 in the depicted embodiment is preferably made of a metal such as aluminum or copper, as non-limiting examples, or where thermal management is less of an issue, materials such as FR4 (flame retardant type 4) epoxy laminate, PTFE (poly-tetra-fluoro-ethylene) or plastic. In another embodiment, advantageous features from multiple technologies may be combined with use of FR4 having a layer of copper on both sides to provide a substrate 14 devised from familiar materials which may provide heat conduction or a ground plane.

Figure 9:
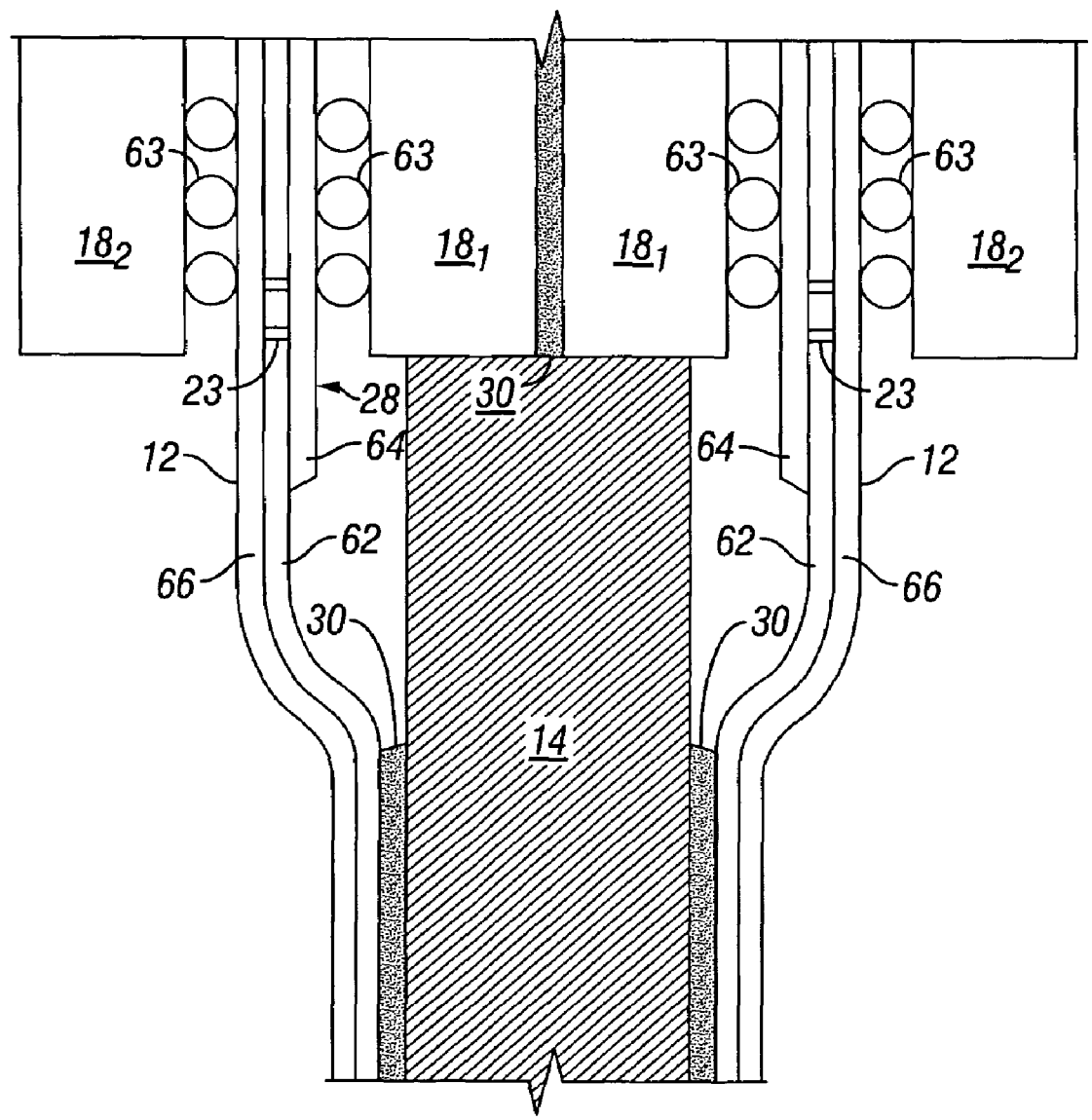
FIG. 9 is an enlarged view of a portion of one preferred embodiment.

FIG. 9 is an enlarged view of a portion of one preferred embodiment showing lower IC $18_1$ and upper IC $18_2$ and substrate 14 having cutaway areas into which ICs 18 are disposed. In this embodiment, conductive layer 66 of flex circuit 12 contains conductive traces connecting module contacts 20 to BGA contacts 63 on ICs $18_1$ and $18_2$. The number of layers may be devised in a manner to achieve the bend radius required in those embodiments that bend flex circuit 12 around edge 16A or 16B, for example. The number of layers in any particular portion of flex circuit 12 may also be devised to achieve the necessary connection density given a particular minimum trace width associated with the flex circuit technology used. Some flex circuits 12 may have three or four or more conductive layers. Such layers may be beneficial to route signals in a FB-DIMM which may have fewer DIMM input/output signals than a registered DIMM, but may have more interconnect traces required among devices on the DIMM, such as, for example, the C/A copy A and C/A copy B (command/address) signals produced by an FB-DIMM AMB.

In this embodiment, there are three layers of flex circuit 12 between the two depicted ICs $18_1$ and $18_2$. Conductive layers 64 and 66 express conductive traces that connect to the ICs and may further connect to other discrete components (not shown). Preferably, the conductive layers are metal such as, for example, copper or alloy 110. Vias such as the exemplar vias 23 connect the two conductive layers 64 and 66 and thereby enable connection between conductive layer 64 and module contacts 20. In this preferred embodiment having a three-layer portion of flex circuit 12, the two conductive layers 64 and 66 may be devised in a manner so that one of them has substantial area employed as a ground plane. The other layer may employ substantial area as a voltage reference plane. The use of plural conductive layers provides advantages and the creation of a distributed capacitance intended to reduce noise or bounce effects that can, particularly at higher frequencies, degrade signal integrity, as those of skill in the art will recognize. If more than two conductive layers are employed, additional conductive layers may be added with insulating layers separating conductive layers. Portions of flex circuit 12 may in some embodiments be rigid portions (rigid-flex). Construction of rigid-flex circuitry is known in the art.

With the construction of an embodiment such as that shown in FIG. 9, thermal energy will be urged to move between the respective ICs $18_1$. Thus, the ICs become a thermal mass sharing the thermal load. Flex circuit 12 may be particularly devised to operate as a heat spreader or sink adding to the thermal conduction out of ICs $18_1$ and $18_2$.

Figure 10:
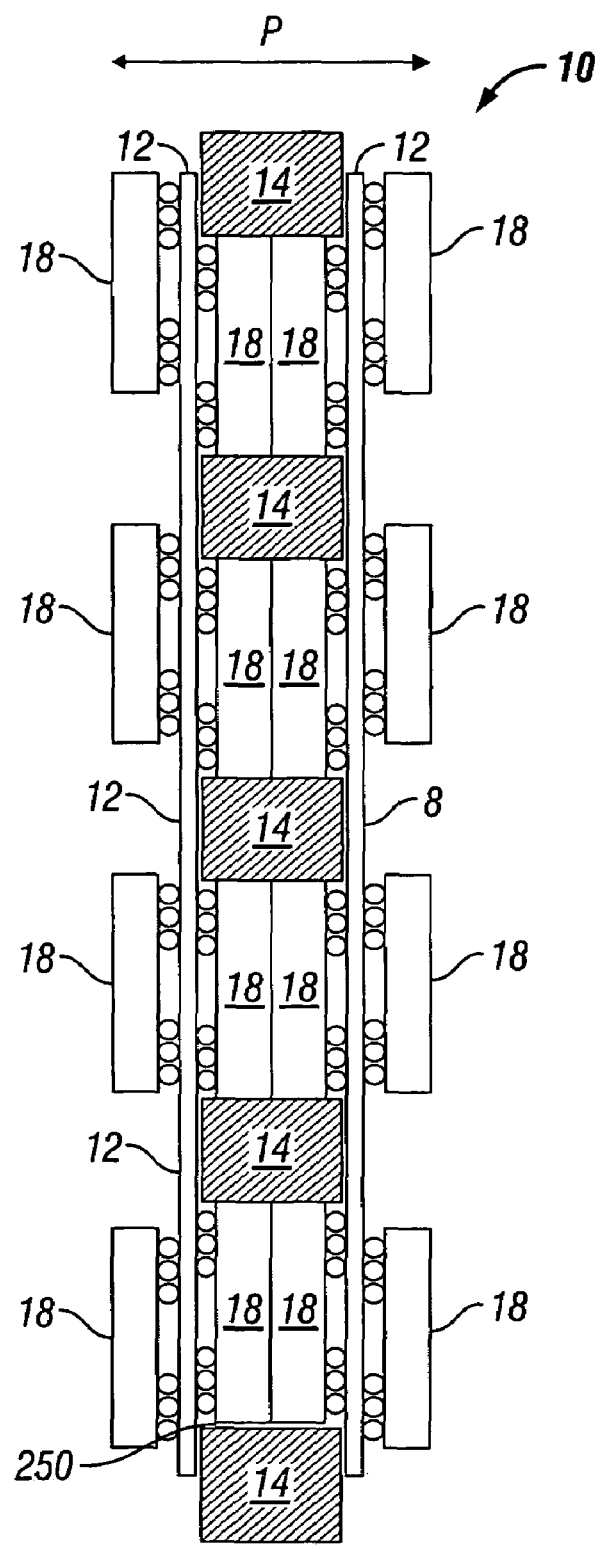
FIG. 10 depicts one perspective of an exemplar module devised in accordance with a preferred embodiment of the present invention.

FIG. 10 depicts one perspective of an exemplar module 10 devised in accordance with a preferred embodiment of the present invention. As those of skill will understand, the depiction of FIG. 10 is simplified to show more clearly the principles of the invention but depicts fewer ICs 18 than would typically be presented in embodiments of the present invention.

The principles of the present invention may, however, be employed where only one IC 18 is resident on a side of a flex circuit 12 or where multiple ranks or pluralities of ICS are resident on a side of flex circuit 12, or, as will be later shown, where multiple ICs 18 are disposed one atop the other to give a single module 10 materially greater.

FIG. 10 depicts a cross sectional view of an exemplar module showing a reduced number of ICs 18 to allow a clearer exposition of the principles of the present invention as illustrated by this depicted embodiment. The module shown in FIG. 10 is formed with an exemplar flex circuit such as that depicted in FIGS. 2 and 3. The second side 9 of flex circuit 12 shown in FIG. 3 is folded about substrate 14 shown in FIG. 10 to place ICs 18 into the windows 250 arrayed along substrate 14. This results in ICs of ranks $IC_{R1}$ and $IC_{R2}$ being disposed back to back within windows 250. Preferably, a thermally conductive adhesive or glue is used on the upper sides of ICs 18 to encourage thermal energy flow as well as provide some mechanical advantages. Those of skill will recognize that in this embodiment, where FIG. 10 depicts the first or, in this case, the outer side of the flex circuit once combined with substrate 14, the flex circuit itself will have staggered mounting arrays 11A on side 8 of flex circuit 12 relative to side 9 of flex circuit 12. This is merely one relative arrangement between ICs 18 on respective sides of substrate 14.

As shown in FIG. 10, ICs 18 which are on second side 9 (which in this depiction is the inner side with respect to the module 10) of populated flex circuit 12 are disposed in windows 250 so that the upper surfaces $18_T$ of ICs 18 of row ICR1 of F1 are in close proximity with the upper surfaces $18_T$ of ICs 18 of rank ICR1 of F2. Thus, a first group of ICs (CSPs in the depiction) may be considered to be comprised of the ICs of $IC_{R1}$ from both fields F1 and F2 while a second group of ICs may be considered to be comprised of the ICs of $IC_{R2}$ from both fields F1 and F2. The ICs 18 that are populated along side 9 of flex circuit 12 are positioned in the cutaway areas of the first and second lateral sides, respectively, of substrate 14. In this case, the cutaway areas on each lateral side of substrate 14 are in spatial coincidence to create windows 250. Those of skill will recognize that the depiction is not to scale but representative of the interrelationships between the elements and the arrangement results in a profile "P" for module 10 that is significantly smaller than it would have been without fitting ICs 18 along inner side 9 of flex circuit 12 into windows 250. Profile P in this case is approximately the sum of the distances between the upper and lower surfaces of IC 18 plus 4× the diameter of the BGA contacts 63 plus 2× the thickness of flex circuit 12 in addition to any adhesive layers 30 employed to adhere one IC 18 to another. This profile dimension will vary depending upon whether BGA contacts 63 are disposed below the surface of flex circuit 12 to reach an appropriate conductive layer or contacts which typically are a part of flex circuit 12.

Figure 11:
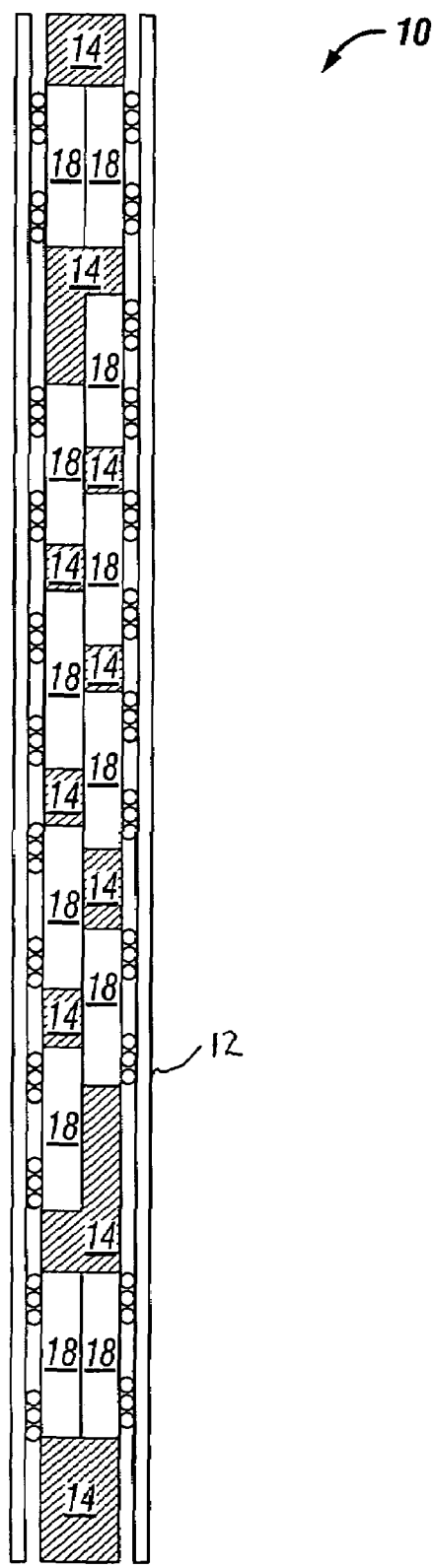
FIG. 11 is another depiction of the relationship between flex circuitry and a substrate 14 which has been patterned or windowed with cutaway areas.

FIG. 11 is another depiction of the relationship between flex circuitry and a substrate 14 which has been patterned or windowed with cutaway areas. The view of FIG. 11 is taken along a line that would intersect the bodies of ICs 18. In FIG. 11, two flex circuits 12A and 12B are shown populated along their respective sides 9 with ICs 18 (i.e., CSPs in the depiction). The ICs 18 along the inner side 9 of flex circuit 12A are staggered relative to those that are along inner side 9 of flex circuit 12B when module 10 is assembled and flex circuits 12A and 12B are combined with substrate 14. This staggering may result in some construction benefits providing a mechanical "step" for ICs 18 as they are fitted into substrate 14 and may further provide some thermal advantages increasing the contact area between substrate 14 and the plurality of ICs 18. Those of skill will recognize that flex circuits 12A and 12B even though depicted as being populated on only one side, may be populated on either or both sides 8 and 9 just as in those embodiments that employ a single flex circuit 12 may be populated one or both sides of flex circuit 12 and may have populated one or both fields or ranks within fields on one or both sides with CSPs or other circuits.

Figure 12:
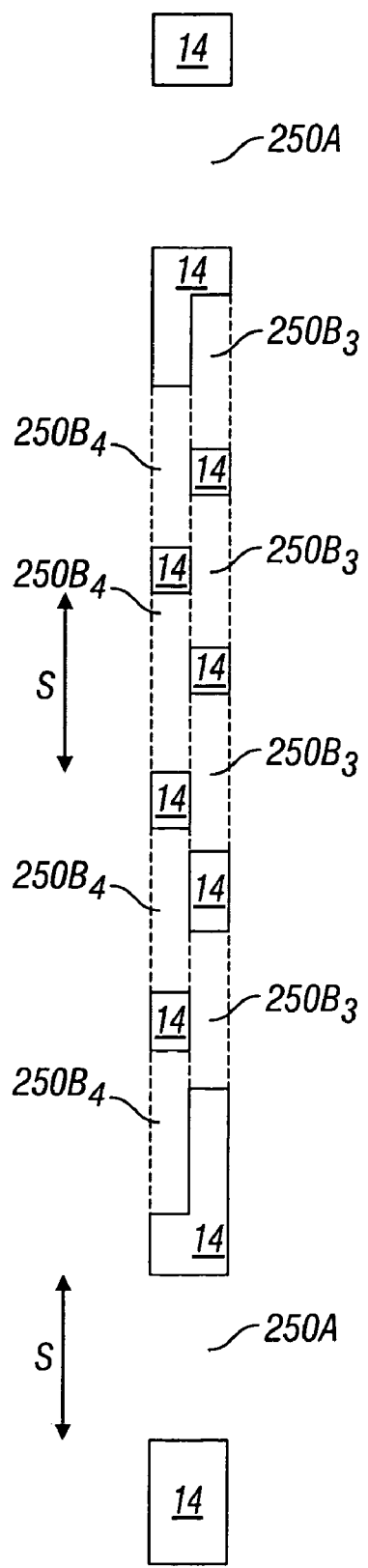
FIG. 12 depicts a cross sectional view of an exemplar substrate employed in FIG. 11 before being combined with populated flex circuits.

FIG. 12 depicts a cross sectional view of exemplar substrate 14 employed in FIG. 11 before being combined with populated flex circuits 12A and 12B as viewed along a line through windows 250 of substrate 14. As depicted in FIG. 12, a number of cutaway areas or pockets are delineated with dotted lines and identified with references 250B3 and 250B4, respectively. Those areas identified as 250B3 correspond, in this example, to the pockets, sites, or cutaway areas on one side of substrate 14 into which ICs 18 from flex circuit 12A will be disposed when substrate 14 and flex circuit 12A are combined. Those pocket, sites, or cutaway areas identified as references 250B4 correspond to the sites into which ICs 18 from flex circuit 12B will be disposed.

For purposes herein, the term window may refer to an opening all the way through substrate 14 across span "S" which corresponds to the width or height dimension of packaged IC 18 or, it may also refer to that opening where cutaway areas on each of the two sides of substrate 14 overlap.

Where cutaway areas 250B3 and 250B4 overlap, there are, as depicted, windows all the way through substrate 14. In some embodiments, cutaway areas 250B3 and 250B4 may not overlap or in other embodiments, there may be pockets or cutaway areas only on one side of substrate 14. Those of skill will recognize that cutaway areas such as those identified with references 250B3 and 250B4 may be formed in a variety of ways depending on the material of substrate 14 and need not literally be "cut" away but may be formed by a variety of molding, milling and cutting processes as is understood by those in the field.

Figure 13:
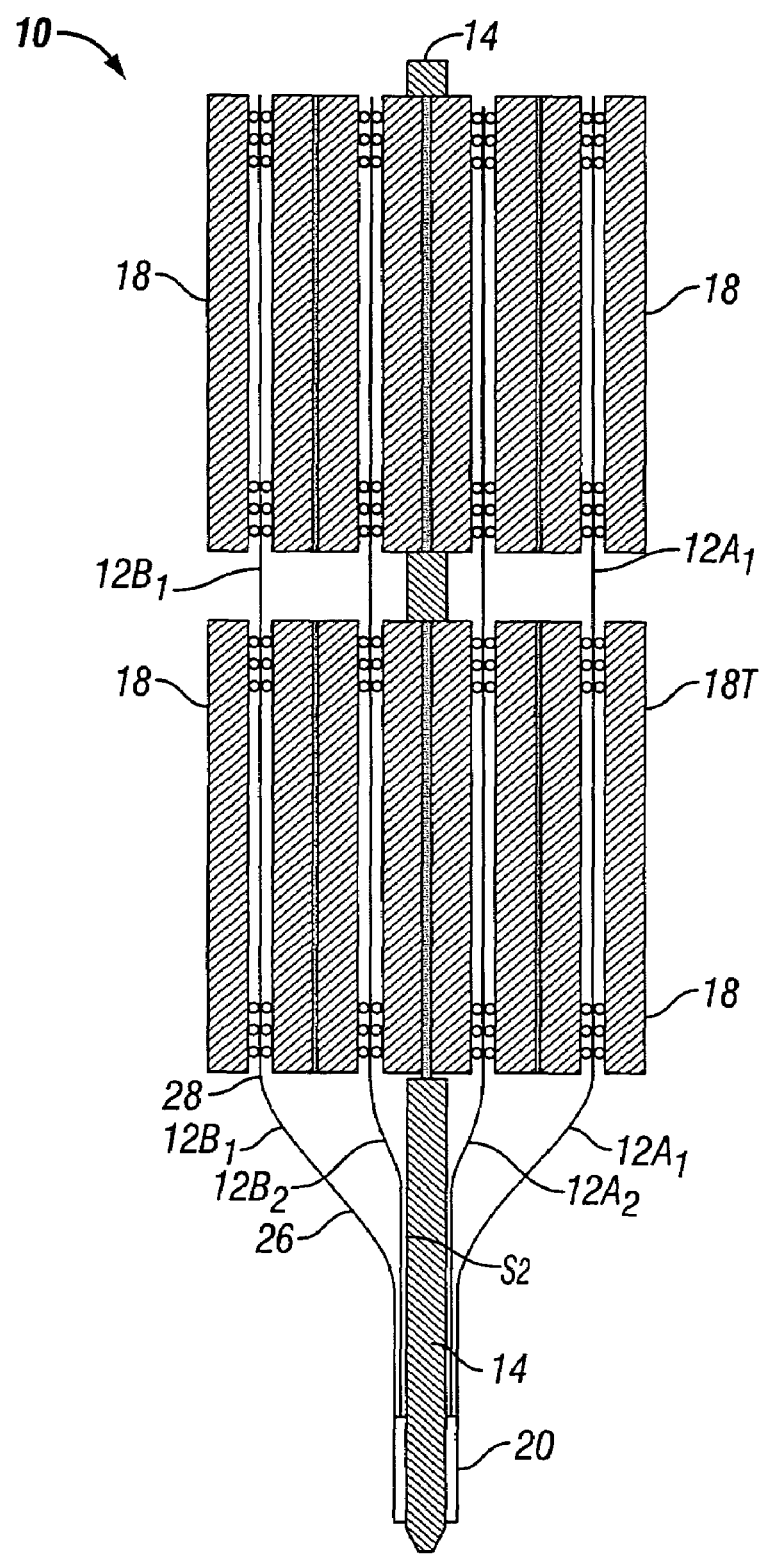
FIG. 13 depicts another embodiment of the invention having additional ICs.

FIG. 13 depicts another embodiment of the invention having additional ICs 18. In this embodiment, four flex level transitions 26 connect to four mounting portions 28 of flex circuits $12A_1$, $12A_2$, $12B_1$, and $12B_2$. In this embodiment, each mounting portion 28 has ICs 18 on both sides. Flex circuitry 12 may also be provided in this configuration by, for example, having a split flex with layers interconnected with vias. As those of skill will recognize, the possibilities for large capacity iterations of module 10 are magnified by such strategies and the same principles may be employed where the ICs 18 on one side of substrate 14 are staggered relative to those ICs 18 on the other side of substrate 14 or, substrates such as those shown in FIG. 4 that have no cutaway areas may be employed.

Four flex circuits are employed in module 10 as depicted in FIG. 13 and, although those embodiments that wrap flex circuit 12 about end 16A of substrate 14 present manufacturing efficiencies, in some environments having flex circuitry separate from each other may be desirable.

Figure 14:
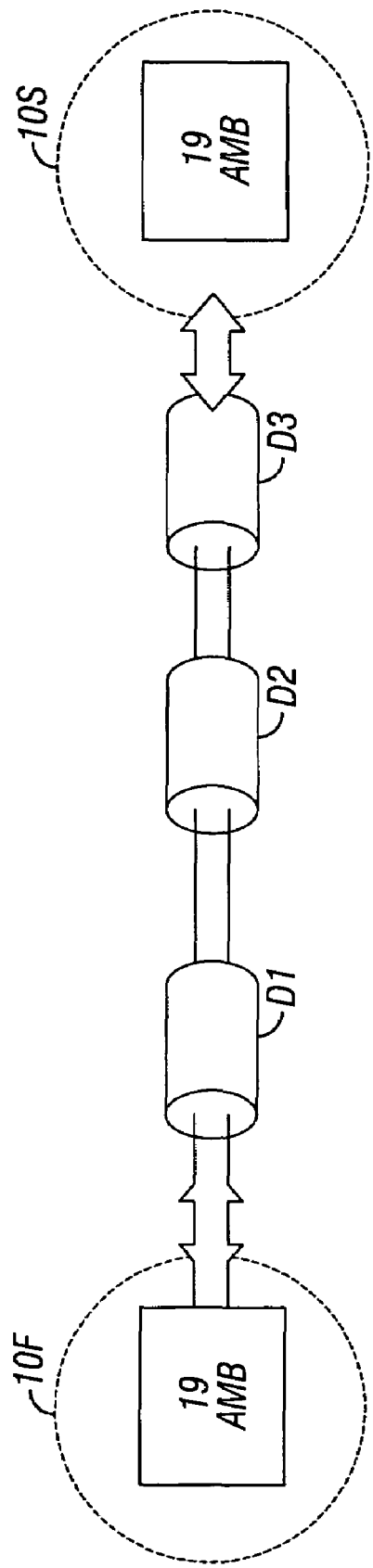
FIG. 14 is a representation of impedance discontinuities in typical FB-DIMM systems.

In a typical FB-DIMM system employing multiple FB-DIMM circuits, the respective AMB's from one FB-DIMM circuit to another FB-DIMM circuit are separated by what can be conceived of as three impedance discontinuities as represented in the system depicted in FIG. 14 as D1, D2, and D3. FIG. 14 includes two modules 10 and includes a representation of the connection between the two modules. Discontinuity D1 represents the impedance discontinuity effectuated by the connector-socket combination associated with the first module 10F. Discontinuity D2 represents the impedance perturbation effectuated by the connection between the connector-socket of first module 10F and the connector-socket of second module 10S while discontinuity D3 represents the discontinuity effectuated by the connector-socket combination associated with the second module 10S. The AMB is the new buffer technology particularly for server memory and typically includes a number of features including pass-through logic for reading and writing data and commands and internal serialization capability, a data bus interface, a deserialing and decode logic capability and clocking functions. The functioning of an AMB is the principal distinguishing hard feature of a FB-DIMM module. Those of skill will understand how to implement the connections between ICs 18 and AMB 19 in FB-DIMM circuits implemented by embodiments of the present invention and will recognize that the present invention provides advantages in capacity as well as reduced impedance discontinuity that can hinder larger implementations of FB-DIMM systems. Further, those of skill will recognize that various principles of the present invention can be employed to multiple FB-DIMM circuits on a single substrate or module.

Figure 15:
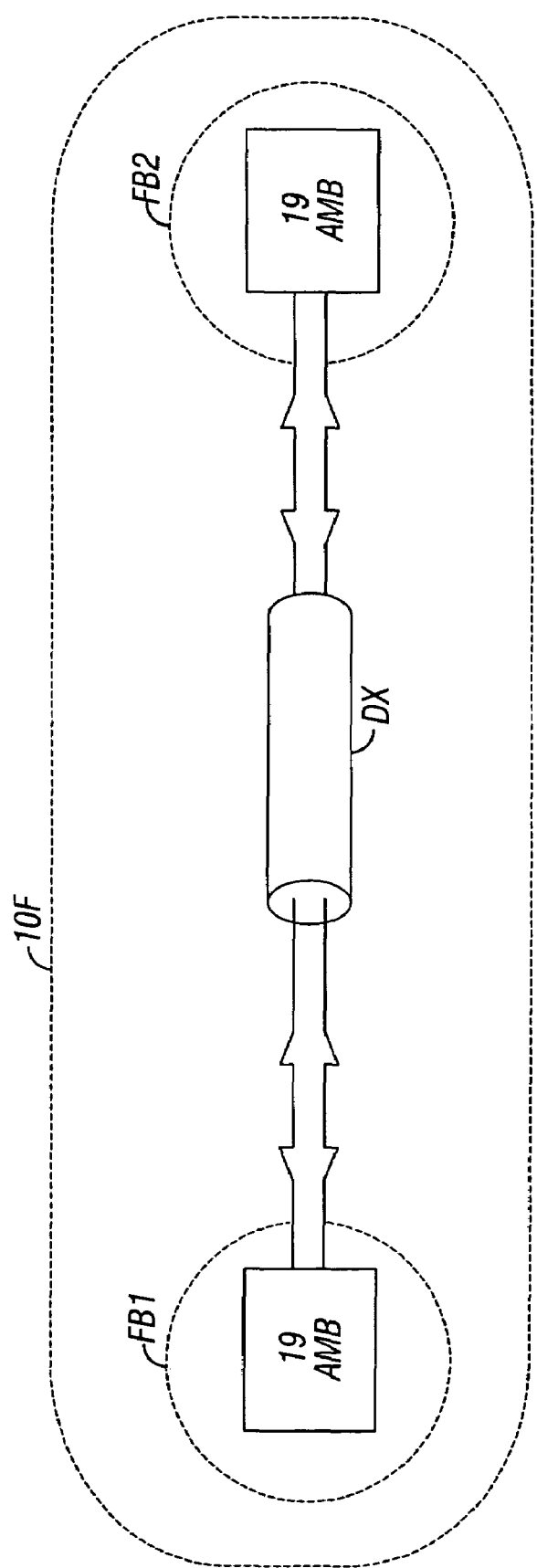
FIG. 15 is a representation of impedance discontinuities in an embodiment of the present invention.

In contrast to the system represented by FIG. 14, FIG. 15 is a schematic representation of the single impedance perturbation DX effectuated by the connection between a first AMB 19 of a first FB-DIMM "FB1" of a first module 10F and a second AMB 19 of a second FB-DIMM "FB2" of the same first module 10F.

Figure 16:
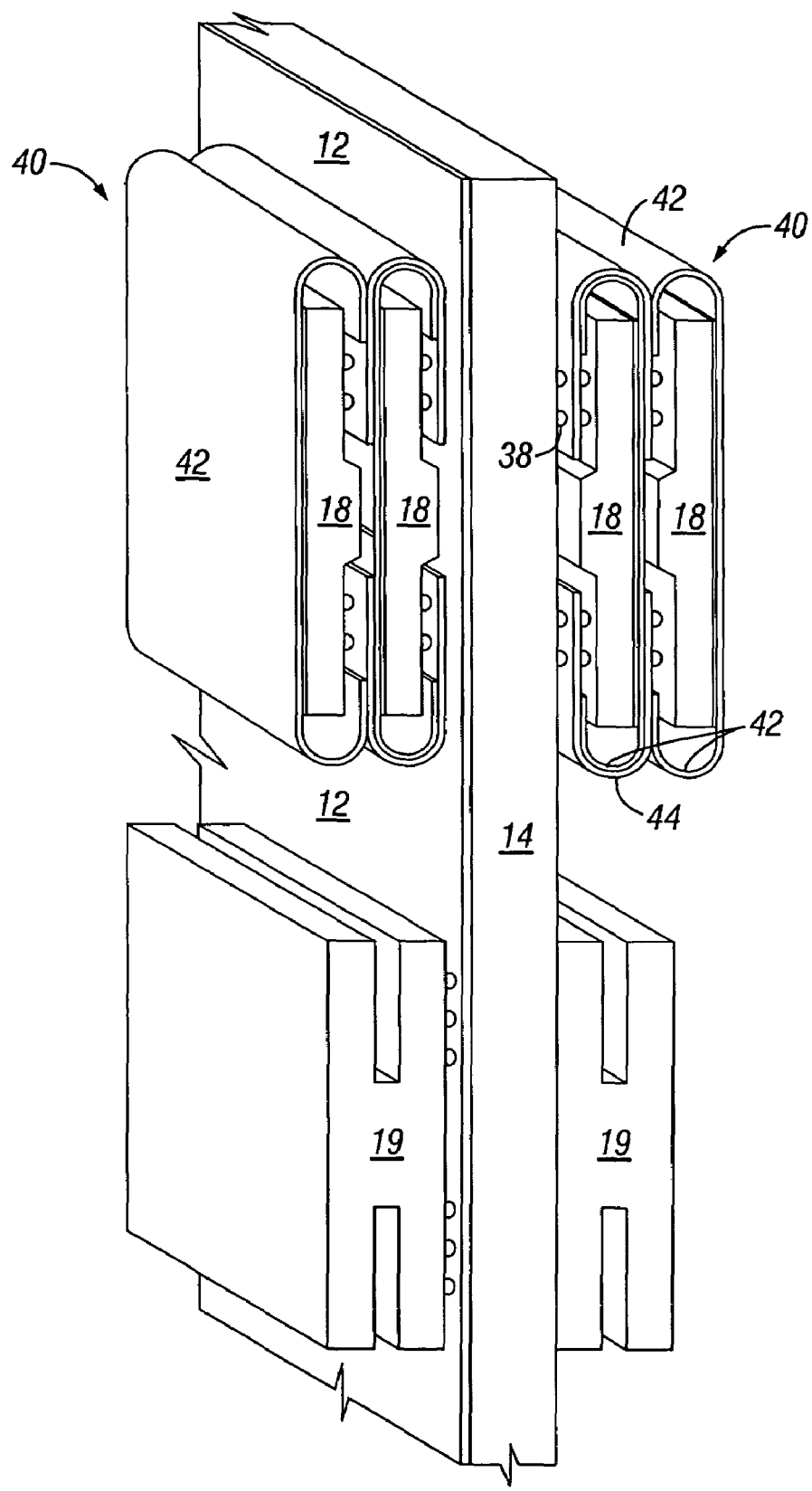
FIG. 16 depicts yet another embodiment of the present invention.

FIG. 16 depicts another embodiment of the present invention in which a module 10 is devised using stacks to create a module 10 presenting two FB-DIMM circuits. Those of skill will appreciate that using stacks such as depicted stacks 40 owned by Staktek Group L.P. allows creating modules that have multiple FB-DIMM circuits on a single module. Stacks 40 are just one of several stack designs that may be employed with the present invention. Stacks 40 are devised with mandrels 42 and stack flex circuits 44 as described in U.S. patent application Ser. No. 10/453,398, filed Jun. 6, 2003 which is owned by Staktek Group L.P. and which is hereby incorporated by reference and stacks 40 and AMB 19 are mounted on flex circuit 12 which is disposed about substrate 14.

Figure 17:
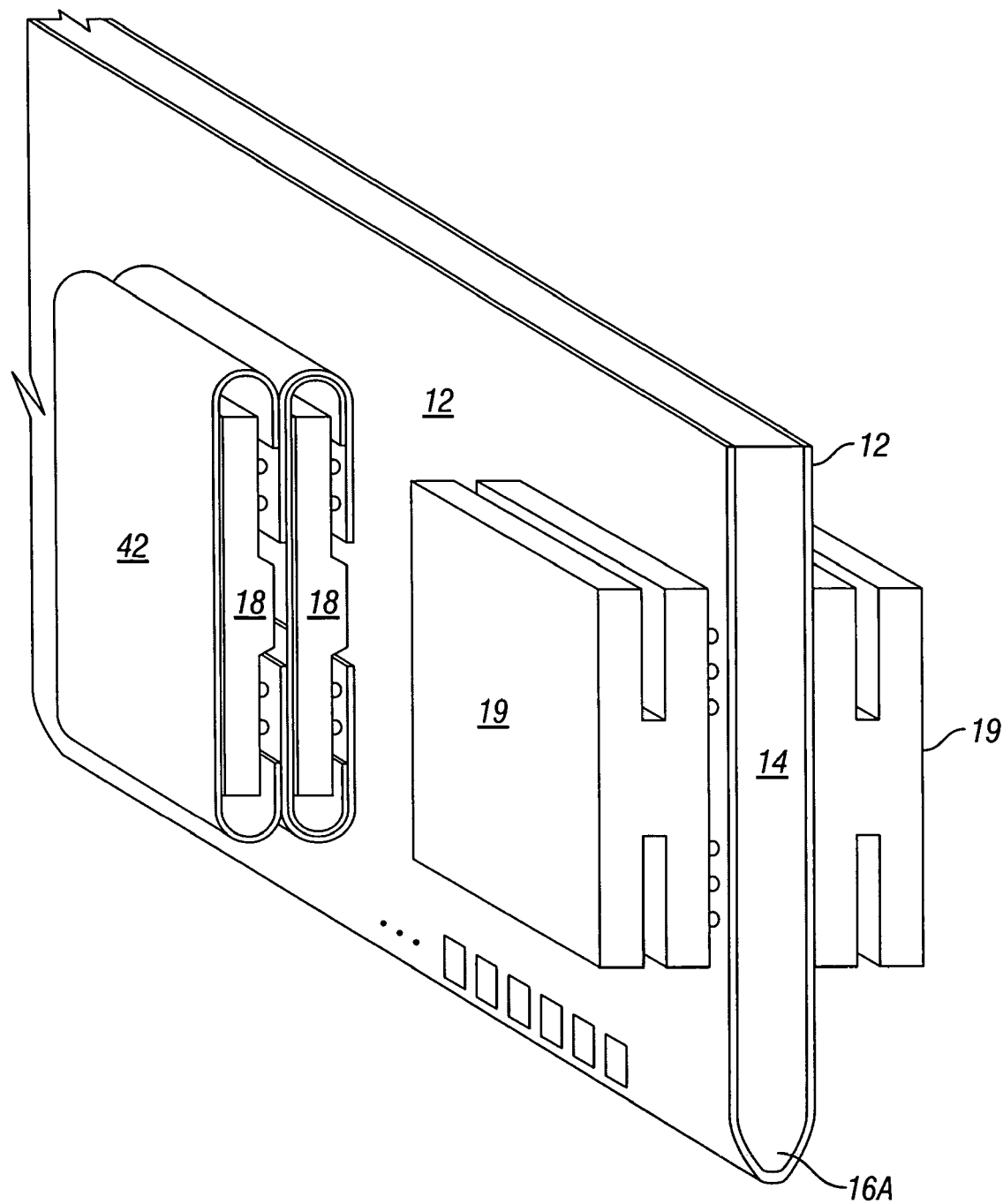
FIG. 17 presents another embodiment of the present invention.

FIG. 17 depicts use of stacks in an embodiment of the present invention that exhibits a low profile with use of stacks. Such an embodiment presents at least two FB-DIMM circuits at its contacts 20.

Figure 18:
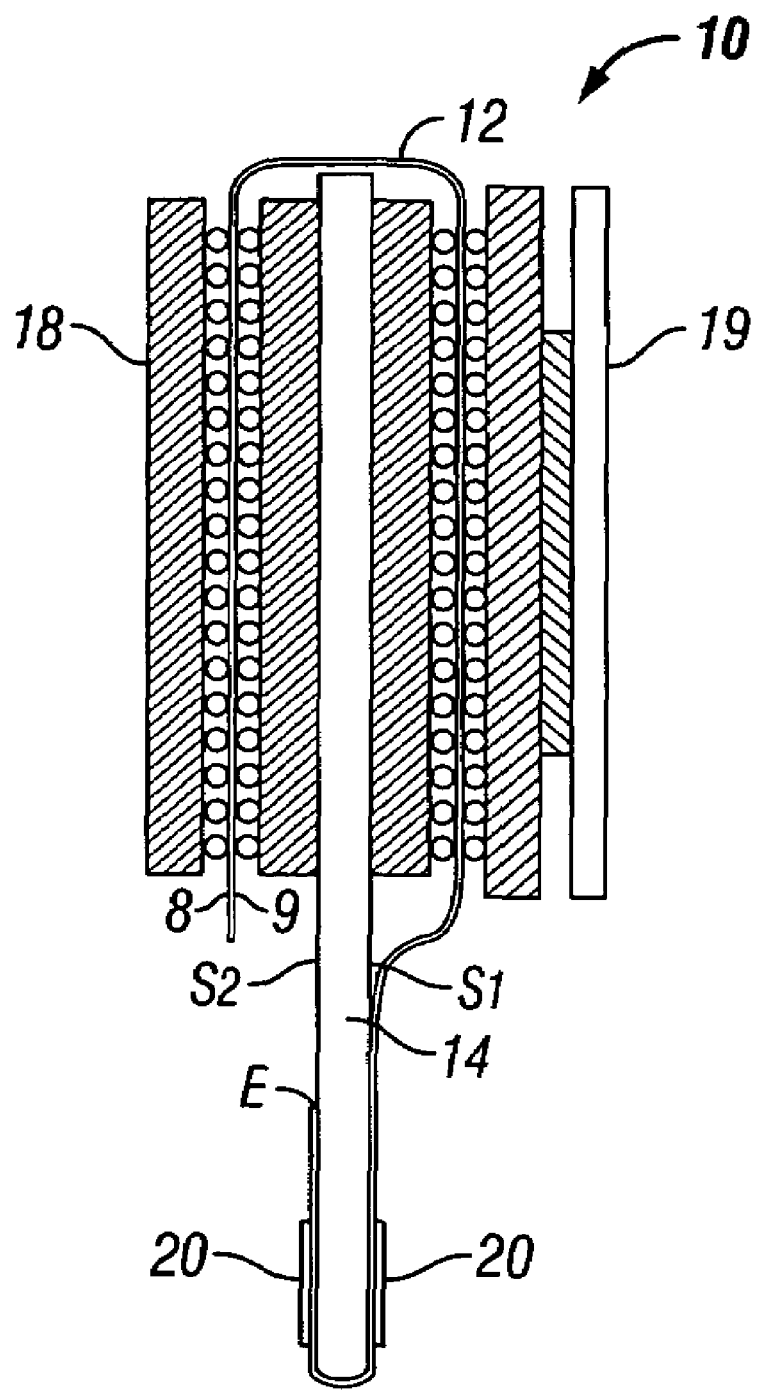
FIG. 18 depicts a low profile embodiment of the present invention.

FIG. 18 illustrates a low profile embodiment of the present invention. The depicted module 10 has at least two AMBs and associated circuitry such as ICs 18 which in the preferred mode and as illustrated are CSPs and needed support circuitry to create at least two FB-DIMM circuits or instantiations on a single module with a low profile. It should be understood that the second AMB in addition to the one literally shown can be disposed on either side of module 10 but preferably will be disposed closer to lateral side S2 of substrate 14 than is the depicted AMB 19 but like AMB 19 will be disposed on side 8 of flex circuit 12. In this embodiment, contacts 20 are along side 8 of flex circuit 12 and proximal to edge E of flex circuit 12. The principal circuits that constitute the first FB-DIMM circuitry or instantiation (i.e., the CSPs and AMB) may be disposed in single rank file as shown. They may be allocated to first and second mounting fields of the first and second sides of flex circuit 12 as earlier described with reference to earlier Figs. Those of skill will recognize that contacts 20 may appear on one or both sides of module 10 depending on the mechanical contact inter-face particulars of the application.

The present invention may be employed to advantage in a variety of applications and environment such as, for example, in computers such as servers and notebook computers by being placed in motherboard expansion slots to provide enhanced memory capacity while utilizing fewer sockets. The two high rank embodiments or the single rank high embodiments may both be employed to such advantage as those of skill will recognize after appreciating this specification.

One advantageous methodology for efficiently assembling a circuit module 10 such as described and depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14. Flex 12 may be laminated or otherwise attached to substrate 14.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
   a flex circuit having a first side that has plural edge connector contacts for connection of the circuit module to an edge connector, the first side having mounted thereon, a first advanced memory buffer (AMB) and plural CSPs (chipscale packaged devices), a second side having mounted thereon, a second advanced memory buffer (AMB) and plural CSPs; and
   a rigid substrate having first and second opposing lateral Sides and a bottom edge, the Hex circuit being wrapped about the bottom edge of the rigid substrate to be inserted in a single edge connector socket, and the second advanced memory buffer and plural CSPs mounted on the second side of the flex circuit being disposed proximal to the rigid substrate while the first advanced memory buffer mad plural CSPs are exposed on the outside of the circuit module and the plural edge connector contacts of the flex circuit are supported by the rigid substrate.

2. The circuit module of claim 1 connected to a circuit board through the plural edge connector contacts.

3. The circuit module of claim 1 in which at least one of the plural CSPs mounted on the second side of the flex circuit is adhesively connected to the rigid substrate.

4. The circuit module of claim 3 in which the adhesive connection is implemented with a thermally conductive adhesive.

5. The circuit module of claim 1 in which the rigid substrate is comprised of metal.

6. The circuit module of claim 1 in which the rigid substrate is comprised of aluminum.

7. The circuit module of claim 1 in which the rigid substrate is patterned to provide cutaway areas into which are disposed one or more of the plural CSPs mounted on the second side of the flex circuit.

8. The circuit module of claim 1 in which the plural CSPs mounted on the first side of the flex circuit and the first advanced memory buffer circuit comprise a FB-DIMM instantiation.

9. The circuit module of claim 1 in which a First group of the plural CSPs mounted on the first side of the flex circuit and a first group of the plural CSPs mounted on the second side of the flex circuit comprise a first FB-DIMM instantiation.

10. The circuit module of claim 9 in which a second group of the plural CSPs mounted on the first side of the flex circuit and a second group of the plural CSPs mounted on the second side of the flex circuit comprise a second FB-DIMM instantiation.

11. A circuit module comprising:
    a flex circuit having a first side, and a second side and along the first side first and second lateral pluralities of edge connector contacts;
    first and second ranks of CSP (chipscale package) memory devices mounted on the first side of the flex circuit with the first rank of CSP memory devices being separated from the second rank of CSP memory devices by the lateral plurality of edge connector contacts;
    plural CSP memory devices mounted on the second side of the flex circuit; first and second AMBs (advanced memory buffers) with the first AMB being disposed on the first side of the flex circuit with the first rank of CSP memory devices and the second AMB being disposed on the first side of the flex circuit with the second rank of CSP memory devices; and
    a rigid substrate having a first lateral side and a second lateral side and a bottom edge, the flex circuit being wrapped about the bottom edge to be inserted in a single edge connector socket and the first rank of CSPs being disposed on one external side of the circuit module and the second rank of CSPs being disposed on the other external side of the circuit module while the plural CSP memory devices, mounted on the second side of the flex circuit, are between the flex circuit and the rigid substrate and the first lateral plurality of edge connector contacts of the flex circuit being supported by the first lateral side of the rigid substrate and the second lateral plurality of edge connector contacts of the flex circuit being supported by the second lateral side of the rigid substrate.

12. The circuit module of claim 11 in which at least some of the CSP memory devices are comprised of stacks.

13. The circuit module of claim 11 in which the substrate is comprised of metal.

14. The circuit module of claim 11 set in an edge connector socket in a computer.

* * * * *

UNITED STATES PATENT AND TRADEMARK OFFICE
CERTIFICATE OF CORRECTION

PATENT NO. : 7,511,968 B2  Page 1 of 1
APPLICATION NO. : 11/007551
DATED : March 31, 2009
INVENTOR(S) : Paul Goodwin It is certified that error appears in the above-identified patent and that said Letters Patent is hereby corrected as shown below:

In Claim 1, Column 11, Line 18, delete "Sides" and insert -- sides --, therefor.

In Claim 1, Column 11, Line 18, delete "Hex" and insert -- flex --, therefor.

In Claim 9, Column 12, Line 1, delete "First" and insert -- first --, therefor.

Signed and Sealed this

Fourteenth Day of July, 2009

JOHN DOLL
*Acting Director of the United States Patent and Trademark Office*